(12) United States Patent
Yu

(10) Patent No.: US 12,105,391 B2
(45) Date of Patent: Oct. 1, 2024

(54) DISPLAY PANEL AND LIQUID CRYSTAL DISPLAY DEVICE

(71) Applicant: WUHAN CHINA STAR OPTOELECTRONICS TECHNOLOGY CO., LTD, Wuhan (CN)

(72) Inventor: Wenqiang Yu, Wuhan (CN)

(*) Notice: Subject to any disclaimer, the term of this patent is extended or adjusted under 35 U.S.C. 154(b) by 294 days.

(21) Appl. No.: 17/281,260

(22) PCT Filed: Mar. 15, 2021

(86) PCT No.: PCT/CN2021/080760
§ 371 (c)(1),
(2) Date: Mar. 30, 2021

(87) PCT Pub. No.: WO2022/160421
PCT Pub. Date: Aug. 4, 2022

(65) Prior Publication Data
US 2023/0099536 A1    Mar. 30, 2023

(30) Foreign Application Priority Data
Jan. 27, 2021 (CN) .......................... 202110113299.1

(51) Int. Cl.
*G02F 1/1368* (2006.01)
*G02F 1/13357* (2006.01)
(Continued)

(52) U.S. Cl.
CPC ...... *G02F 1/1368* (2013.01); *G02F 1/133621* (2013.01); *G02F 1/136286* (2013.01);
(Continued)

(58) Field of Classification Search
CPC .................................................. G02F 1/1368
See application file for complete search history.

(56) References Cited

U.S. PATENT DOCUMENTS

2006/0028593 A1* 2/2006 Lim ...................... G02F 1/1368
349/44
2007/0165147 A1* 7/2007 Kamijima ........... H01L 27/1218
257/E27.113
(Continued)

FOREIGN PATENT DOCUMENTS

| CN | 104952885 A | 9/2015 |
| CN | 105006486 A | 10/2015 |

(Continued)

OTHER PUBLICATIONS

International Search Report in International application No. PCT/CN2021/080760, mailed on Oct. 26, 2021.
(Continued)

*Primary Examiner* — Sang V Nguyen

(57) ABSTRACT

A display panel and a liquid crystal display device are provided by the present application. The display panel includes a thin film transistor, a data line, and a scanning line. The thin film transistor includes an active layer, and the active layer includes a first section extending along a length direction of the data line and overlapping the data line, wherein the first section is electrically connected to the data line; a second section extending along the length direction of the data line; and a third section connecting the first section and the second section and extending along a length direction of the scanning line and overlapping the scanning line.

13 Claims, 6 Drawing Sheets

(51) Int. Cl.
   *G02F 1/1362* (2006.01)
   *H01L 27/12* (2006.01)
   *H01L 29/786* (2006.01)

(52) U.S. Cl.
   CPC ........ *H01L 27/1222* (2013.01); *H01L 27/124* (2013.01); *H01L 29/78621* (2013.01); *H01L 29/78675* (2013.01); *G02F 2201/52* (2013.01); *G02F 2202/06* (2013.01)

(56) References Cited

U.S. PATENT DOCUMENTS

| | | | |
|---|---|---|---|
| 2015/0309346 A1* | 10/2015 | Oh | H01L 27/124 438/30 |
| 2016/0231632 A1 | 8/2016 | Yu et al. | |
| 2017/0162144 A1* | 6/2017 | Chen | G09G 3/3655 |
| 2018/0081222 A1* | 3/2018 | Guo | G02B 6/005 |
| 2019/0206905 A1* | 7/2019 | Gu | H01L 29/41733 |
| 2020/0089069 A1* | 3/2020 | Morinaga | H01L 27/1225 |
| 2020/0203532 A1* | 6/2020 | Yamazaki | H01L 29/78648 |
| 2020/0243021 A1* | 7/2020 | Li | G09G 3/3266 |
| 2020/0286432 A1* | 9/2020 | Zhang | G09G 3/3258 |
| 2021/0408293 A1* | 12/2021 | Chiang | H01L 21/02587 |
| 2022/0044636 A1* | 2/2022 | Mou | G09G 3/3258 |

FOREIGN PATENT DOCUMENTS

| | | | | |
|---|---|---|---|---|
| CN | 105932068 A | | 9/2016 | |
| CN | 105977307 A | | 9/2016 | |
| CN | 106950772 | * | 7/2017 | ........... G01F 1/1362 |
| CN | 106950772 A | | 7/2017 | |
| CN | 107490917 A | | 12/2017 | |

OTHER PUBLICATIONS

Written Opinion of the International Search Authority in International application No. PCT/CN2021/080760, mailed on Oct. 26, 2021.

* cited by examiner

DISPLAY PANEL AND LIQUID CRYSTAL DISPLAY DEVICE

The present application relates to the field of display technologies and particularly to a display panel and a liquid crystal display device.

At present, virtual reality (VR) and augmented reality (AR) technologies have been introduced into military and aviation fields. High resolution is a trend of development of virtual reality technology. Resolution of about 1000 in the market still cannot satisfy the demand of high resolution of virtual reality technology.

Therefore, it is necessary to propose a technical solution to improve resolution.

SUMMARY OF INVENTION

The present application aims to provide a display panel and a liquid crystal display device which is conducive to the improvement of display panels and liquid crystal display devices.

To achieve the goal above, a display panel is provided by the present application. The display panel includes a thin film transistor, a data line, and a scanning line, wherein the thin film transistor includes an active layer, and the active layer includes:

a first section extending along a length direction of the data line and overlapping the data line, wherein the first section is electrically connected to the data line;

a second section extending along the length direction of the data line; and a third section connecting the first section and the second section, and extending along a length direction of the scanning line and overlapping the scanning line.

A liquid crystal display device is also provided by the present application, including a display panel and a backlight module, the display panel is located on a light exiting side of the backlight module, A display panel and a liquid crystal display device are provided by the present application. The display panel includes a thin film transistor, a data line, and a scanning line, wherein the thin film transistor includes an active layer, and the active layer includes: a first section extending along a length direction of the data line and overlapping the data line, wherein the first section is electrically connected to the data line; a second section extending along the length direction of the data line; and a third section connecting the first section and the second section, and extending along a length direction of the scanning line and overlapping the scanning line. The design of the active layer of the thin film transistor allows the thin film transistor with one gate electrode, which is conducive to the realization of high resolution of the display panel and the liquid crystal display device. Moreover, as the third section extends along the length direction of the scanning line, the length of the third section will not be limited under the circumstance of high resolution.

DETAILED DESCRIPTION OF EMBODIMENTS

The present application is further described in detail below with reference to the accompanying drawings and embodiments. Obviously, the following described embodiments are only part of the present application but not all. A person having ordinary skill in the art may obtain other embodiments based on the embodiments provided in the present application without making any creative effort, which all belong to the scope of the present application.

Mainly restricted by the process capability of liquid crystal display (LCD) panels, minimum line width and line distance of LCD panels is about 1.5 microns, minimum via size is about 2 microns in conventional technologies, and maximum resolution of corresponding LCD panels is about 1000, there is little room for great improvement of resolution.

Figure 1:
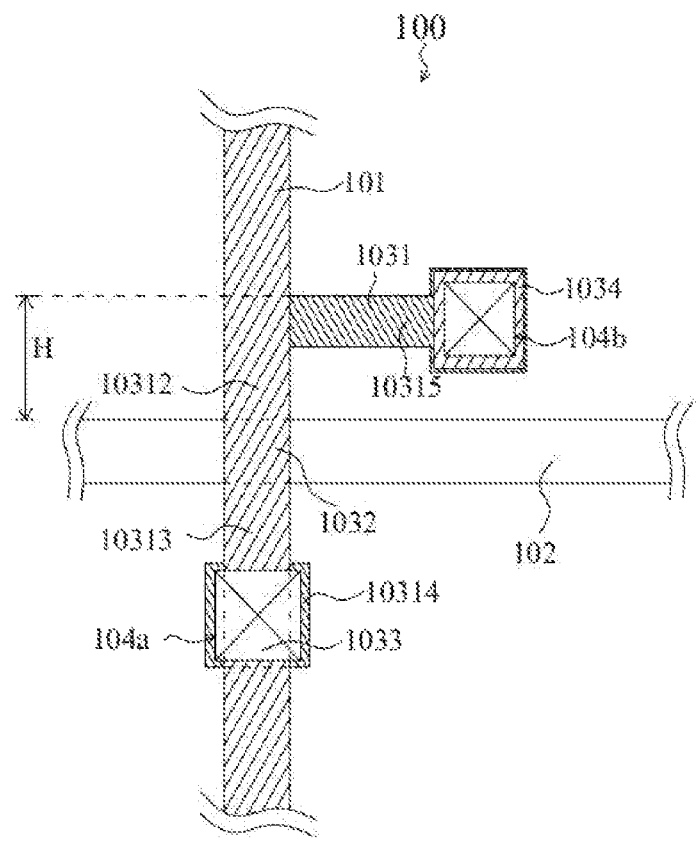
FIG. 1 is a partially enlarged schematic diagram of a conventional display panel.
Figure 2:
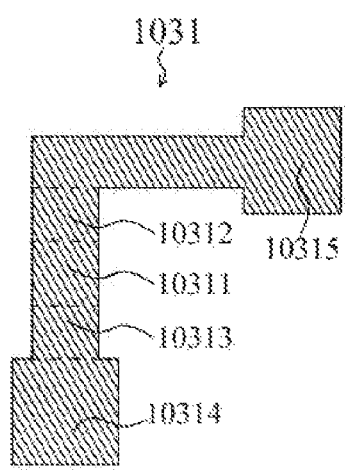
FIG. 2 is a schematic diagram of an active layer of FIG. 1.
Figure 3:
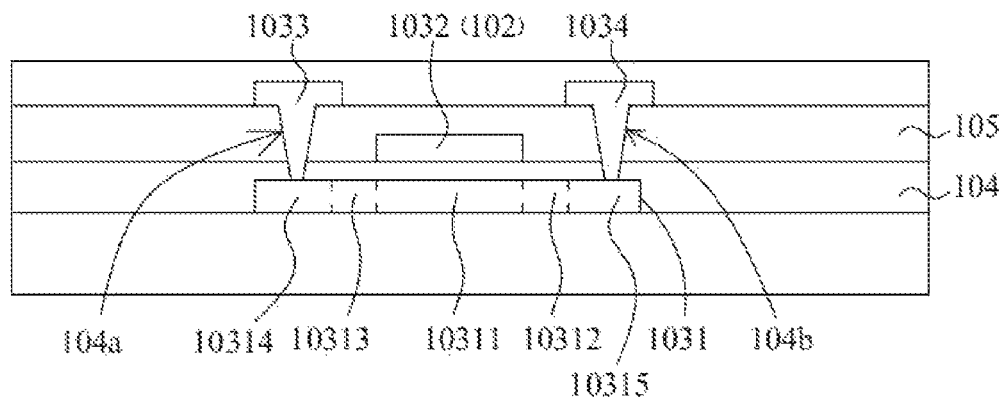
FIG. 3 is a cross-sectional schematic diagram of the display panel of FIG. 1.

In addition, for high-resolution display panels, there is no extra space for thin film transistors with two gate electrodes arranged in a same layer. The design of thin film transistors with one gate electrode is one of the methods to improve resolution. As shown in FIG. 1 to FIG. 3, FIG. 1 is a partially enlarged schematic diagram of a conventional display panel, FIG. 2 is a schematic diagram of an active layer in FIG. 1, and FIG. 3 is a cross-sectional schematic diagram of the display panel of FIG. 1. A conventional display panel 100 includes a plurality of sub-pixels, a plurality of data lines 101 and a plurality of scanning lines 102. Each of the sub-pixels includes a thin film transistor and a pixel electrode (not shown in the figures) electrically connected to the thin film transistor. Each of the thin film transistors is also electrically connected to one of the data lines 101 and one of the scanning lines 102. The thin film transistors are under the control of the scanning signals input by the scanning lines 102 and control the transmission of data signals from the data lines 101 to the pixel electrodes.

Each of the thin film transistors includes an active layer 1031, a gate electrode 1032, a source electrode 1033, and a drain electrode 1034. The active layer 1031 has an "L" shape. The active layer 1031 includes a channel portion 10311, a first lightly doped portion 10312, a second lightly doped portion 10313, a source highly doped portion 10314, and a drain highly doped portion 10315. The first lightly doped portion 10312 is connected between the source highly doped portion 10315 and the channel portion 10311, and the second lightly doped portion 10313 is connected between the drain highly doped portion 10314 and the channel portion 10311. In a length direction of the data line 101, the second lightly doped portion 10313, the channel portion 10311, the first lightly doped portion 10312, and part of the drain highly doped portion 10315 extend in sequence, and the channel portion 10311 is perpendicular to the scanning line 102.

Part of the data line 101 constitutes the source electrode 1033 of the thin film transistor. An overlapping part of the scanning line 102 and the active layer 1031 is the gate electrode 1032 of the thin film transistor. An overlapping part of active layer 1031 and the scanning line 102 is the channel portion 10311. The drain electrode 1034 is disposed on a same layer as the data line 101. A gate insulating layer 104 is disposed between the active layer 1031 and the scanning line 102, and an interlayer insulating layer 105 is disposed between the scanning line 102 and the source electrode 1033. The source electrode 1033 and the source highly doped portion 10314 of the active layer 1031 are electrically connected by the first via 104a penetrating the gate insulating layer 104 and the interlayer insulating layer 105. The drain electrode 1034 and the drain highly doped portion 10315 of the active layer 1031 are electrically connected by the second via 104b penetrating the gate insulating layer 104 and the interlayer insulating layer 105. The L-shaped active layer 1031 is partially overlapped with the data line 101.

In the design of the display panel of FIG. 1, when a sum of a width of one of the data lines and a distance between two adjacent data lines is 11 microns, the maximum resolution of the display panel is 2300. Furthermore, in order to reduce the space in the length direction of the data lines occupied by the thin film transistors to improve resolution, a length of the channel portion 10311 cannot be too great, while if the length of the channel portion 10311 is too little, it is easy for the thin film transistors to lose its switching characteristics.

Targeting the problems of conventional technologies, the active layer of the thin film transistor of the display panel includes the first section, the second section, and the third section; the third section connects the first section and the second section; the first section extends along the length direction of the data line and overlaps the data line, and the first section is electrically connected to the data line; the second section extends along the length direction of the data line; and the third section extends along the length direction of the scanning line and overlaps the scanning line; the scanning line overlaps the third section to form a gate electrode to constitute a thin film transistor with one gate electrode, which is conducive to the high resolution of the display panel. Furthermore, considering the need to reduce a size of the thin film transistor along the length direction of the data line, a length of the third section can be controlled and designed with more flexibility as the third section extends along the length direction of the scanning line, which can solve the problem of short channel effect when the third section functions as a channel.

Figure 4:
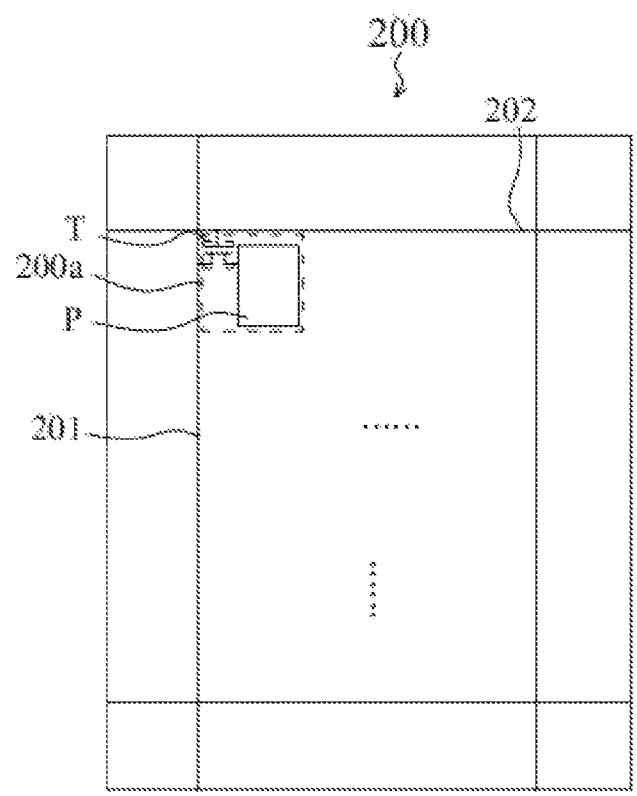
FIG. 4 is a schematic diagram of a display panel of a first embodiment of the present application.
Figure 7:
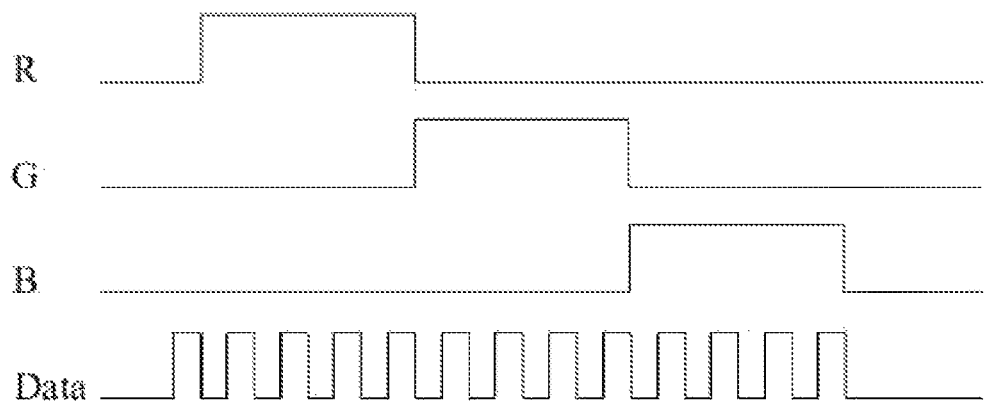
FIG. 7 is a sequence diagram of field sequential driving of a liquid crystal display device of an embodiment of the present application.

A liquid crystal display device is also provided by the present application. The liquid crystal display device includes a liquid crystal display panel and a backlight module, and the liquid crystal display panel is located on a light exiting side of the backlight module. As shown in FIG. 4 and FIG. 7, FIG. 4 is a schematic diagram of the display panel of the first embodiment of the present application. FIG. 7 is a sequence diagram of field sequential driving of the liquid crystal display device of the embodiment of the present application. The display panel 200 is a liquid crystal display panel. The display panel 200 can satisfy the requirement of high resolution for virtual reality technologies and augmented reality technologies. The display panel 200 includes a plurality of sub-pixels 200a arranged in a matrix, a plurality of data lines 201, and a plurality of scanning lines 202. The plurality of data lines 201 extend in a vertical direction and are arranged side by side in a horizontal direction, and the plurality of scan lines 202 extend in the horizontal direction and are arranged side by side in the vertical direction. The data lines and the scanning lines are insulated from each other and vertically intersect each other. Each of the sub-pixels 200a is square. The display panel 200 realizes color display without red, blue, and green color resistors. The backlight module includes red lights emitting red light, blue lights emitting blue light, and green lights emitting green light. The sub-pixels are driven in field sequential driving mode, and one of the sub-pixels displays red, green, and blue in time-sharing. Color images are synthesized by using the persistence of human vision.

Specifically, a frame of the display panel 200 includes three sub-frames. The three sub-frames include a first sub-frame, a second sub-frame, and a third sub-frame. A frame frequency of the display panel 200 is 60 Hz, and a frame frequency of the backlight module corresponding to each of the sub-frames is 180 Hz. As shown in FIG. 7, in the first sub-frame, the backlight module emits red light R to irradiate the display panel 200; in the second sub-frame, the backlight module emits green light G to irradiate the display panel 200; in the third sub-frame, the backlight module emits blue light B to irradiate the display panel 200. During one frame time, the data lines 201 transmit data signals Data corresponding to each of the sub-frames.

In the present embodiment, each of the sub-pixels 200a includes a thin film transistor T and a pixel electrode P. Each of the thin film transistors T is electrically connected to one of the data lines 201, one of the scanning lines 202, and one of the pixel electrodes P to transmit the data signal transmitted by the one of the data lines 202 to the one of the pixel electrodes P according to the scanning signal input by the one of the scanning lines 202.

Figure 5:
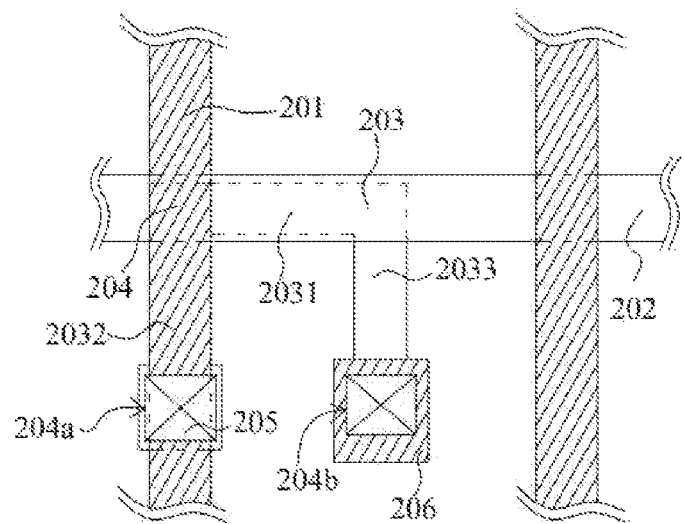
FIG. 5 is a partially enlarged schematic diagram of the display panel of FIG. 4.

As shown in FIG. 5, FIG. 5 is a partially enlarged schematic diagram of the display panel of FIG. 4. Each of the thin film transistors T includes an active layer 203, a gate electrode 204, a source electrode 205, and a drain electrode 206. The source electrode 205 is part of the data line 201, so that the source electrode 205 of the thin film transistor T is electrically connected to the data line 201. The drain electrode 206 and the data line 201 are in a same layer and arranged at intervals, and the drain electrode 206 of the thin film transistor T is electrically connected to the pixel electrode P. An overlapping part of the scanning line 202 and the active layer 203 is the gate electrode 204, and there is only one gate electrode 204. An overlapping part of active layer 203 and the scanning line 202 is the third section 2031, the third section 2031 is the channel portion, and there is only one channel portion. The thin film transistors T are low temperature polysilicon transistors. It can be understood that the thin film transistors can also be metal oxide thin film transistors.

Figure 6:
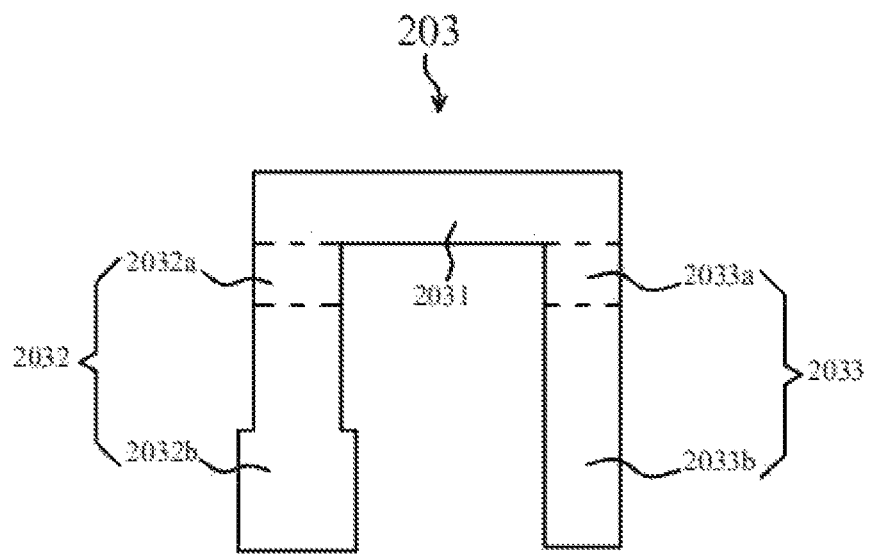
FIG. 6 is a schematic diagram of an active layer of FIG. 5.

As shown in FIG. 5 and FIG. 6, FIG. 6 is a schematic diagram of the active layer in FIG. 5. The active layer 203 includes the first section 2032, the second section 2033 and the third section 2031, and the third section 2031 connects the first section 2032 and the second section 2033. The first section 2032 extends along the length direction of the data line 201 and overlaps the data line 201, and the first section 2032 is electrically connected to the data line 201. The second section 2033 extends in the length direction of the data line 201. The third section 2031 extends along the length direction of the scanning line 202 and overlaps the scanning line 202. The first section 2032 and the second section 2033 are located on a same side of the third section 2031. The second section 2033 is electrically connected to the pixel electrode P in the row of the scanning line 202.

Specifically, third section 2031 has a shape of straight line and the third section 2031 is parallel to the scanning line 202. The first section 2032 and the second section 2033 are both vertical to the third section 2031. The first section 2032 includes a first lightly doped portion 2032a and a source highly doped portion 2032b, and the first lightly doped portion 2032a is located between the source highly doped portion 2032b and the third section 2031. The second section 2033 includes a second lightly doped portion 2033a and a drain highly doped portion 2032b, and the second lightly doped portion 2033a is located between the drain highly doped portion 2032b and the third section 2031. The third segment 2031 is not doped. The source highly doped portion 2032b is electrically connected to the source electrode 205, so that the first section 2032 is electrically connected to the data line 201. The drain highly doped portion 2032b is electrically connected to the drain electrode 206, so that the second section 2033 is electrically connected to the pixel electrode P.

It should be noted that each of the first lightly doped portion 2032a, the second lightly doped portion 2033a, the source highly doped portion 2032b, and the drain highly doped portion 2033b is obtained by doping a semiconductor active layer. Doping treatment includes N-type doping and P-type doping. Phosphorus, arsenic, and other elements can be used for N-type doping, while boron, gallium, and other elements can be used for P-type doping. Concentrations of dopants in the source highly doped portion 2032b and the drain highly doped portion 2033b are greater than concentrations of dopants in the first lightly doped portion 2032a and the second lightly doped portion 2033a.

In this embodiment, since the first section 2032 and the second section 2033 are located on the same side of the third section 2031, at least part of the first section 2032 and at least part of the second section 2033 in one of the active layers 203 are arranged side by side in the length direction of the data line 201. Compared with the design of the display panel shown in FIG. 1, in the length direction of the data line 201, a height of the active layer of the display panel shown in FIG. 5 is reduced by H, so that the space for a thin film transistor in the length direction of the data line 201 is reduced, and there is more space for sub-pixels in the length direction of the data line 201, which is conducive to the improvement of resolution of the display panel.

Specifically, the first lightly doped portion 2032a and the second lightly doped portion 2033a of a same active layer 203 are arranged side by side on a side of the third section 2031. The first lightly doped portion 2032a is same as the second lightly doped portion 2033a, meaning that a size of the first lightly doped portion 2032a is same as a size of the second lightly doped portion 2033a.

In this embodiment, as the third section 2031 extends along the length direction of the scanning line 202 and overlaps the scanning line 202, a length of the third section 2031 can be more flexibly designed, and the length of the third section 2031 can be greater than or equal to 2 microns, so as to avoid short channel effect under the circumstance that the length of the third section 2031 is less than 2 microns. For example, the length of the third section 2031 can be 2.5 microns, 3 microns, 4 microns, and 5 microns.

In this embodiment, the first section 2032 is arranged in parallel with the data line 201 to reduce the space occupied by the sub-pixels in the horizontal direction. The second section 2033 is arranged on a side of the data line 201 and parallel to the data line 201. Specifically, the second section 2033 has a shape of straight line.

Figure 8:
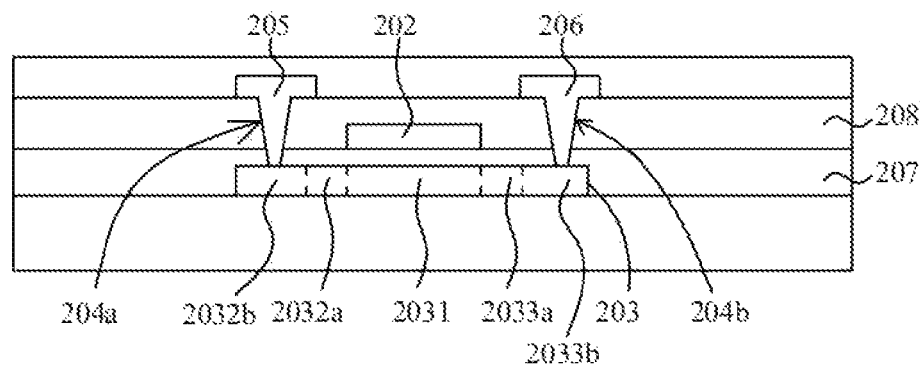
FIG. 8 is a cross-sectional schematic diagram of the display panel of FIG. 4.

In this embodiment, as shown in FIG. 8, which is a cross-sectional schematic diagram of the display panel of FIG. 4. A gate insulating layer 207 is disposed between the active layer 203 and the scanning line 202, and an interlayer insulating layer 208 is disposed between the scanning line 202 and the source electrode 205. The source electrode 205 and the source highly doped portion 2032b are electrically connected through the third via 204a penetrating the gate insulating layer 207 and the interlayer insulating layer 208, and the drain electrode 206 and the drain highly doped portion 2033b are electrically connected through the fourth via 204b penetrating the gate insulating layer 207 and the interlayer insulating layer 208.

Space occupied by the sub-pixels in the length direction of the data lines is reduced by the design of the active layer, data lines, and scanning lines of the liquid crystal display device in this embodiment, and thus more sub-pixels can be arranged in the length direction of the data line, so as to improve the resolution of the display panel. Specifically, compared with the design shown in FIG. 1, space occupied by each of the sub-pixels in the length direction of the data lines can be reduced by 4 microns. Correspondingly, the minimum sum of the width of each of the data lines and the distance between two adjacent data lines of the display panel in this embodiment can be reduced to about 7 microns. Correspondingly, the resolution of the display panel is about 3600, and the resolution of the display panel is improved by about 57%.

Figure 9:
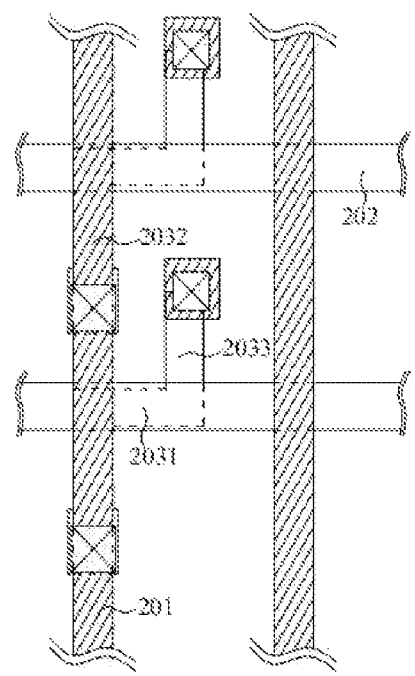
FIG. 9 is a partially enlarged schematic diagram of a display panel of a second embodiment of the present application.
Figure 10:
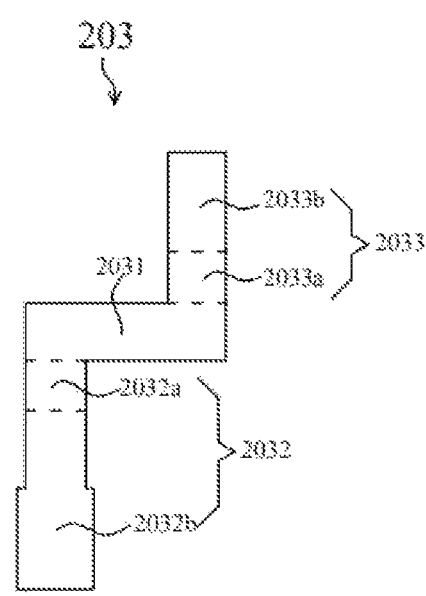
FIG. 10 is a schematic diagram of an active layer of FIG. 9.

Please refer to FIG. 9 and FIG. 10. FIG. 9 is a partially enlarged schematic diagram of the display panel of the second embodiment of the present application, and FIG. 10 is a schematic diagram of the active layer in FIG. 9. The display panel shown in FIG. 9 is basically similar to that shown in FIG. 5. The similarities between FIG. 9 and FIG. 5 include that the first section 2032 extends along the length direction of the data line 201 and overlaps the data line 201, the first section 2032 is electrically connected to the data line 201, the second section 2033 extends along the length direction of the data line 201, the third section 2031 connects the first section 2032 and the second section 2033, the third section 2031 extends along the length direction of the scan line 202 and overlaps the scan line 202, and the third section 2031 is perpendicular to the data line 201. Both the first section 2032 and the second section 2033 are perpendicular to the third section 2031. Differences between FIG. 9 and FIG. 5 include that each of the active layers 203 is Z-shaped, and in the length direction of the scan line 202, the first section 2032 and the second section 2033 are respectively located on both sides of the third section 2031. Differences between FIG. 9 and FIG. 5 also include that the drain electrode 206 of the thin film transistor T is electrically connected to the pixel electrode P of a previous row of the scanning line 202 electrically connected to the thin film transistor T.

The liquid crystal display device of the embodiment of the present application includes a thin film transistor with the Z-shaped active layer, the thin film transistor has only one gate, which is conducive to the improvement the resolution of the display panel.

The description of the above embodiments is only intended to help understand the technical schemes and core concepts of this disclosure. It is noted that those with ordinary skill in the technique field could make various modifications to technical schemes or equivalent replacements to part of the technical features described in embodiments above-mentioned, and these modifications and replacement don't make the substantial of corresponding technical schemes out of the scope of technical schemes of embodiments of the present application.

What is claimed is:

1. A display panel comprising:
a thin film transistor, a data line, and a scanning line, wherein the thin film transistor comprises an active layer, and the active layer comprises:
a first section extending along a length direction of the data line and overlapping the data line, wherein the first section is electrically connected to the data line;
a second section extending along the length direction of the data line; and
a third section directly connecting the first section and the second section, having a shape of straight line and extending along a length direction of the scanning line and overlapping the scanning line;
wherein the first section, the second section, and the third section collectively form a U-shaped structure, and an orthogonal projection of the third section on the active layer is located fully within an orthogonal projection of the scanning line on the active layer;
wherein the first section comprises a first lightly doped portion, the second section comprises a second lightly doped portion, the first lightly doped portion and the second lightly doped portion are arranged side by side on a same side of the third section, and each of the first lightly doped portion and the second lightly doped portion is located adjacent to the third section;
wherein the first section comprises a source highly doped portion, the second section comprises a drain highly doped portion, the first lightly doped portion is located between the source highly doped portion and the third section, and the second lightly doped portion is located between the drain highly doped portion and the third section.

2. The display panel according to claim 1, wherein the first section and the second section are located on a same side of the third section.

3. The display panel according to claim 1, wherein in the length direction of the scanning line, the first section and the second section are located on two sides of the third section respectively.

4. The display panel according to claim 1, wherein the first section is arranged in parallel with the data line, and the second section is arranged in parallel with the data line.

5. The display panel according to claim 1, wherein a length of the third section is greater than or equal to 2 microns.

6. A liquid crystal display device comprising
a display panel and a backlight module, wherein the display panel is located on a light exiting side of the backlight module, and the display panel comprises a thin film transistor, a data line, and a scanning line, wherein the thin film transistor comprises an active layer, and the active layer comprises:
a first section extending along a length direction of the data line and overlapping the data line, and the first section is electrically connected to the data line;
a second section extending along the length direction of the data line; and
a third section directly connecting the first section and the second section, having a shape of straight line and extending along a length direction of the scanning line and overlapping the scanning line;
wherein the first section, the second section, and the third section collectively form a U-shaped structure, and an orthogonal projection of the third section on the active layer is located fully within an orthogonal projection of the scanning line on the active layer;
wherein the first section comprises a first lightly doped portion, the second section comprises a second lightly doped portion, the first lightly doped portion and the second lightly doped portion are arranged side by side on a same side of the third section, and each of the first lightly doped portion and the second lightly doped portion is located adjacent to the third section;
wherein the first section comprises a source highly doped portion, the second section comprises a drain highly doped portion, the first lightly doped portion is located between the source highly doped portion and the third section, and the second lightly doped portion is located between the drain highly doped portion and the third section.

7. The liquid crystal display device according to claim 6, wherein
the first section and the second section are located on a same side of the third section.

8. The liquid crystal display device according to claim 6, wherein
in the length direction of the scanning line, the first section, and the second section are located on two sides of the third section respectively.

9. The liquid crystal display device according to claim 6, wherein
the first section is arranged in parallel with the data line, and the second section is arranged in parallel with the data line.

10. The liquid crystal display device according to claim 6, wherein
a length of the third section is greater than or equal to 2 microns.

11. The display panel according to claim 1, wherein the thin film transistor is a single channel thin film transistor.

12. A display panel comprising:
a thin film transistor, a data line, and a scanning line, wherein the thin film transistor comprises an active layer, and the active layer comprises:
a first section extending along a length direction of the data line and overlapping the data line, wherein the first section is electrically connected to the data line;
a second section extending along the length direction of the data line; and
a third section connecting the first section and the second section and extending along a length direction of the scanning line and overlapping the scanning line, in the length direction of the scanning line, the first section and the second section are located on two sides of the third section respectively;
wherein the first section, the second section, and the third section collectively form a U-shaped structure, and an orthogonal projection of the third section on the active layer is located fully within an orthogonal projection of the scanning line on the active layer;
wherein the first section comprises a first lightly doped portion, the second section comprises a second lightly doped portion, the first lightly doped portion and the second lightly doped portion are arranged side by side on a same side of the third section, and each of the first lightly doped portion and the second lightly doped portion is located adjacent to the third section;

wherein the first section comprises a source highly doped portion, the second section comprises a drain highly doped portion, the first lightly doped portion is located between the source highly doped portion and the third section, and the second lightly doped portion is located between the drain highly doped portion and the third section.

13. The display panel according to claim 12, wherein the third section directly connects the first section and the second section and having a shape of straight line.

* * * * *